United States Patent
Hsu et al.

(10) Patent No.: US 10,790,180 B2
(45) Date of Patent: Sep. 29, 2020

(54) ELECTROSTATIC CHUCK WITH VARIABLE PIXELATED MAGNETIC FIELD

(71) Applicant: Applied Materials, Inc., Santa Clara, CA (US)

(72) Inventors: Chih-Hsun Hsu, Campbell, CA (US); Tza-Jing Gung, San Jose, CA (US); Benjamin Schwarz, San Jose, CA (US); Shahid Rauf, Pleasanton, CA (US); Ankur Agarwal, Mountain View, CA (US); Vijay D. Parkhe, San Jose, CA (US); Michael D. Willwerth, Campbell, CA (US); Zhiqiang Guo, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/576,645

(22) Filed: Sep. 19, 2019

(65) Prior Publication Data

US 2020/0013661 A1  Jan. 9, 2020

Related U.S. Application Data

(62) Division of application No. 14/094,601, filed on Dec. 2, 2013, now Pat. No. 10,460,968.

(51) Int. Cl.
*H01L 21/683* (2006.01)
*H01J 37/32* (2006.01)

(52) U.S. Cl.
CPC ...... *H01L 21/6833* (2013.01); *H01J 37/3266* (2013.01); *H01J 37/32715* (2013.01)

(58) Field of Classification Search
CPC ........... H01L 21/6833; H01L 21/67069; H01L 21/67017; H01L 21/67242; H01J 37/3266; H01J 37/32715
See application file for complete search history.

(56) References Cited

U.S. PATENT DOCUMENTS

| | | | |
|---|---|---|---|
| 5,529,657 A | 6/1996 | Ishii |
| 6,074,488 A | 6/2000 | Roderick |
| 6,490,146 B2 | 12/2002 | Wang et al. |
| 6,538,872 B1 | 3/2003 | Wang et al. |
| 6,740,853 B1 | 5/2004 | Johnson et al. |
| 8,226,769 B2 | 7/2012 | Matyushkin et al. |
| 8,461,674 B2 | 6/2013 | Gaff et al. |
| 8,546,732 B2 | 10/2013 | Singh |
| 8,587,113 B2 | 11/2013 | Gaff et al. |
| 8,624,168 B2 | 1/2014 | Gaff et al. |
| 8,637,794 B2 | 1/2014 | Singh et al. |

(Continued)

FOREIGN PATENT DOCUMENTS

| | | |
|---|---|---|
| JP | 62136332 A | 6/1987 |
| JP | 2007/162748 | 6/2007 |

(Continued)

*Primary Examiner* — Yuechuan Yu
(74) *Attorney, Agent, or Firm* — Schwabe, Williamson & Wyatt, P.C.

(57) ABSTRACT

Electrostatic chucks with variable pixelated magnetic field are described. For example, an electrostatic chuck (ESC) includes a ceramic plate having a front surface and a back surface, the front surface for supporting a wafer or substrate. A base is coupled to the back surface of the ceramic plate. A plurality of electromagnets is disposed in the base, the plurality of electromagnets configured to provide pixelated magnetic field tuning capability for the ESC.

9 Claims, 7 Drawing Sheets

(56) References Cited

U.S. PATENT DOCUMENTS

| | | |
|---|---|---|
| 8,663,391 B2 | 3/2014 | Matyushkin et al. |
| 8,884,194 B2 | 11/2014 | Singh et al. |
| 8,937,800 B2 | 1/2015 | Lubomirsky et al. |
| 9,196,514 B2 | 11/2015 | Parkhe et al. |
| 2008/0017104 A1 | 1/2008 | Matyushkin et al. |
| 2012/0237682 A1 | 9/2012 | Hong |
| 2013/0161305 A1 | 6/2013 | Ptasienski et al. |
| 2013/0220545 A1 | 8/2013 | Koizumi |
| 2013/0220989 A1 | 8/2013 | Pease et al. |
| 2014/0045337 A1 | 2/2014 | Singh et al. |
| 2014/0047705 A1 | 2/2014 | Singh et al. |
| 2014/0048529 A1 | 2/2014 | Pease |
| 2014/0096909 A1 | 4/2014 | Singh et al. |
| 2014/0154819 A1 | 6/2014 | Gaff et al. |
| 2015/0129165 A1 | 5/2015 | Parkhe et al. |
| 2015/0155193 A1 | 6/2015 | Hsu et al. |
| 2015/0170977 A1 | 6/2015 | Singh |
| 2015/0187625 A1 | 7/2015 | Busche et al. |
| 2015/0187626 A1 | 7/2015 | Parkhe et al. |
| 2015/0228513 A1 | 8/2015 | Parkhe et al. |
| 2015/0311105 A1 | 10/2015 | Sadjadi et al. |
| 2015/0364354 A1 | 12/2015 | Tantiwong et al. |
| 2015/0366004 A1 | 12/2015 | Nangoy et al. |
| 2016/0027678 A1 | 1/2016 | Parkhe et al. |

FOREIGN PATENT DOCUMENTS

| | | |
|---|---|---|
| JP | 2008/171998 | 7/2008 |
| KR | 2009/0108420 | 10/2009 |

ELECTROSTATIC CHUCK WITH VARIABLE PIXELATED MAGNETIC FIELD

CROSS-REFERENCE TO RELATED APPLICATIONS

This application is a Divisional of U.S. patent application Ser. No. 14/094,601, filed on Dec. 2, 2013, the entire contents of which are hereby incorporated by reference herein.

BACKGROUND

1) Field

Embodiments of the present invention pertain to the field of semiconductor processing equipment and, in particular, to electrostatic chucks with variable pixelated magnetic field.

2) Description of Related Art

In a plasma processing chamber, such as a plasma etch or plasma deposition chamber, the plasma density is often an important parameter to control during a process since it can correspond to the amount of ionization available at a location within the plasma.

Often, plasma density is manipulated by thermal means, where a change in the temperature of the plasma can lead to a change in plasma density. For example, a temperature of a substrate holder, commonly called a chuck or pedestal, may be controlled to heat/cool a workpiece to various controlled temperatures during the process recipe (e.g., to control an etch rate). Similarly, a temperature of a showerhead/upper electrode, chamber liner, baffle, process kit, or other component may also be controlled during the process recipe to influence the processing. Conventionally, a heat sink and/or heat source is coupled to the processing chamber to maintain the temperature of a chamber component at a desired temperature. Often, at least one heat transfer fluid loop thermally coupled to the chamber component is utilized to provide heating and/or cooling power. Long line lengths in a heat transfer fluid loop, and the large heat transfer fluid volumes associated with such long line lengths are detrimental to temperature control response times. Point-of-use systems are one means to reduce fluid loop lengths/volumes. However, physical space constraints disadvantageously limit the power loads of such point-of-use systems.

With plasma processing trends continuing to increase RF power levels and also increase workpiece diameters (with 300 mm now typical and 450 mm systems now under development), temperature and/or RF control and distribution addressing both a fast response time and high power loads is advantageous in the plasma processing field. Temperature-based or temperature-only solutions may not achieve the optimal tunability of plasma density. As such, advances are still needed toward plasma density tunability.

SUMMARY

Embodiments of the present invention include electrostatic chucks with variable pixelated magnetic field.

In an embodiment, an electrostatic chuck (ESC) includes a ceramic plate having a front surface and a back surface, the front surface for supporting a wafer or substrate. A base is coupled to the back surface of the ceramic plate. A plurality of electromagnets is disposed in the base, the plurality of electromagnets configured to provide pixelated magnetic field tuning capability for the ESC.

In another embodiment, a semiconductor processing system includes a chamber coupled to an evacuation device, a gas inlet device, a plasma ignition device, and a detector. A computing device is coupled with the plasma ignition device. A voltage source is coupled with a sample holder including an electrostatic chuck (ESC). The ESC is disposed in the chamber and includes a ceramic plate having a front surface and a back surface, the front surface for supporting a wafer or substrate. The ESC also includes a base coupled to the back surface of the ceramic plate. The ESC also includes a plurality of electromagnets disposed in the base. The plurality of electromagnets is configured to provide pixelated magnetic field tuning capability for the ESC. The semiconductor processing system further includes an electrical source. Each of the plurality of electromagnets is independently coupled to the electrical source by a corresponding electrical wiring.

In another embodiment, an electrostatic chuck (ESC) includes a ceramic plate having a front surface and a back surface, the front surface for supporting a wafer or substrate. A base is coupled to the back surface of the ceramic plate. The base has a perimeter. A plurality of electromagnets is disposed to surround the perimeter of the base. The plurality of electromagnets configured to provide pixelated magnetic field tuning capability for the ESC.

DETAILED DESCRIPTION

Figure 1A:
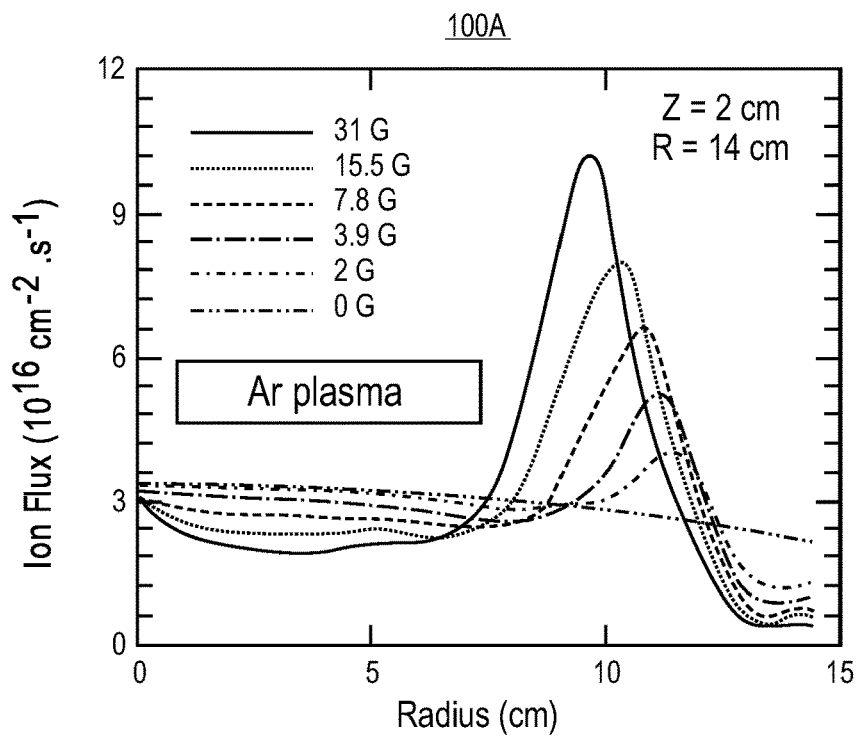
FIG. 1A is a plot of Ion Flux as a function of radius for an argon (Ar) plasma, in accordance with an embodiment of the present invention.

Electrostatic chucks with variable pixelated magnetic field are described. In the following description, numerous specific details are set forth, such as specific chuck and/or chamber configurations, in order to provide a thorough understanding of embodiments of the present invention. It will be apparent to one skilled in the art that embodiments of the present invention may be practiced without these specific details. In other instances, well-known aspects, such as etch processing in the presence of a wafer supported by a chuck, are not described in detail in order to not unnecessarily obscure embodiments of the present invention. Furthermore, it is to be understood that the various embodiments shown in the Figures are illustrative representations and are not necessarily drawn to scale.

One or more embodiments described herein relate to electrostatic chucks with variable pixelated electromagnets or systems including electrostatic chucks with variable pixelated electromagnets. In particular, variable pixelated magnetic field generation may be incorporated into a bonded electrostatic chuck using individualized electrical wiring and a control system to power the individualized wiring for each electromagnet in a pixelated electromagnet arrangement. Applications may include increased plasma density uniformity control for pedestals or electrostatic chucks, e.g., as included in semiconductor processing chambers. Particular embodiments involve the incorporation of a plurality of electromagnets as embedded in an electrostatic chuck for independent and local process control at the wafer level.

To provide context, demand for very uniform wafer temperature and plasma density tunability on an electrostatic chuck is ever increasing. In general, wafer clamping by means of electrostatic chucking has been used to provide temperature control during etch processing. The wafer is clamped to a ceramic or multi-layer surface with a heat sink or heater (or both) depending on application. Due to inherent non-uniformities and auxiliary hardware (e.g., lifter pins, RF/DC electrode(s), etc.) the ceramic surface temperature is not uniform. This non-uniformity translates to the wafer, affecting the etch process. Conventional chuck designs have concentrated on coolant layout optimization and introduction of multiple (up to 4 zones) heaters. Such chuck designs have not been useful for solving issue related to, or caused by, auxiliary hardware (e.g., lifter pins, RF/DC electrode(s), etc.).

More specifically, conventional electrostatic chuck temperature control is typically based on a cooling base and one or more electrical heaters included in the electrostatic chuck. Such an arrangement, however, can have flaws or drawbacks that lead to some level of temperature non-uniformity. For example, bond imperfection between the ceramic layer of the electrostatic chuck and an underlying cooling base which results in thickness variation between the ceramic plate and cooling base can lead to the formation of cold or hot spots across the check. In an example of particular significance to the present disclosure, plasma density variation, e.g., in a plasma etch or deposition chamber, can lead to the formation of hot or cold spots across a wafer or substrate supported by the chuck or pedestal. In accordance with an embodiment of the present invention, as described herein, localized electromagnets are included in or near an electrostatic chuck in order to provide capability to provide a finely tuned magnetic field for the plasma near the chuck. The finely tuned magnetic field can be used to tune plasma density and, hence, plasma uniformity at or near a sample. Embodiments described herein may be directed to next generation etch chamber ESCs with active magnetic field control.

It is understood that magnetron reactive ion etching (RIE) has been employed to provide global magnetic field control over an associated plasma density. However, control in on a localized level is not achievable with such processes or associated apparatuses. By contrast, as described in association with embodiments herein, an ESC having pixelated magnetic field tuning capability is configured to control locally the plasma ionization, e.g., down to the millimeter scale. In one such embodiment, a plurality of electromagnets provides such fine tuning capability. It is to be appreciated that, in such embodiment, the tuning capability can potentially be made even finer than the millimeter scale, but further reduction may be limited by the electromagnet size. In an embodiment, the pixelated arrangement of electromagnets enables the ability to individually alter the etch rate or critical dimension (CD) on a die by die basis for a processed wafer. Thus, while a magnetron affects the global plasma density of an entire chamber where the scale of affected area is tens of inches, the pixelated electromagnet arrangements described herein allow for much finer tuning on a very local basis. In one such embodiment, the pixelated arrangement provides multiple degrees of freedom (e.g., versus a single degree of freedom achieved with a magnetron), and computerization of data acquisition and process execution of each individual die is made possible.

To further demonstrate the concepts at hand, when applying a magnetic field at the wafer level, electrons gyrate around the magnetic field lines and are trapped as a local ionization source. The trapping leads to higher plasma density locally. In addition, the recombination with an associated chamber wall with a magnetic field may be reduced. The gyrofrequency of an electron is provided by equation 1 (eq. 1):

$$\omega = qB/m_e. \qquad (eq.\ 1)$$

Figure 1B:
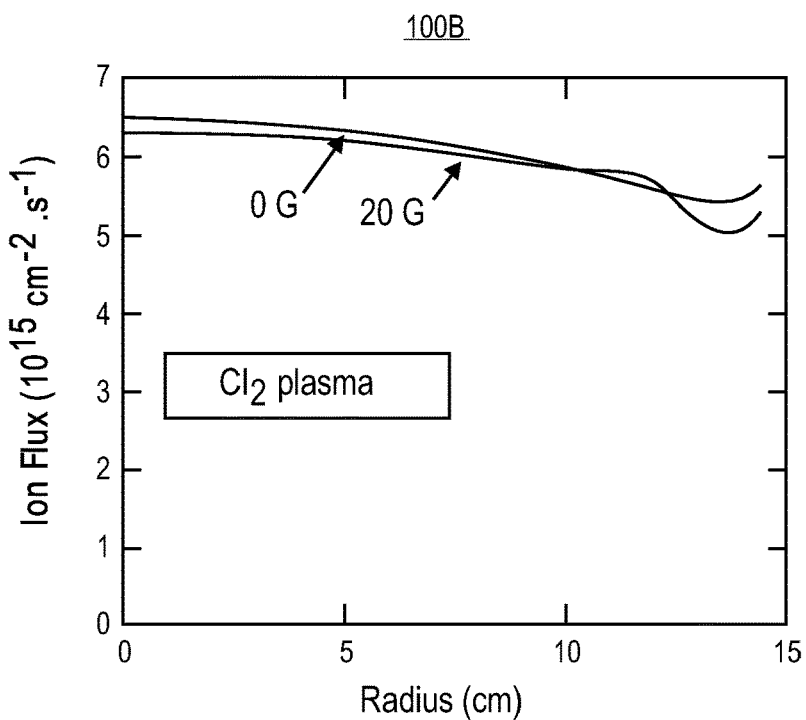
FIG. 1B is a plot of Ion Flux as a function of radius for a chlorine ($Cl_2$) plasma, in accordance with an embodiment of the present invention.

Simulation results indicate that a magnetic field of approximately 4 Gauss is strong enough to deviate the ion flux by ±5%, even in the presence of bias in a Cl2 plasma. For example, FIG. 1A is a plot 100A of Ion Flux as a function of radius for an argon (Ar) plasma, in accordance with an embodiment of the present invention. Referring to plot 100A, an Ar plasma is formed at a density of 10 mTorr and a power of 500 W, with no bias. FIG. 1B is a plot 100B of Ion Flux as a function of radius for a chlorine ($Cl_2$) plasma, in accordance with an embodiment of the present invention. Referring to plot 100B, a $Cl_2$ plasma is formed at a density of 10 mTorr and a power of 300 W, with a 350 W bias. Referring to both plots 100A and 100B, peak magnetic fields are indicated at 14 cm radial location and 2 cm below the wafer. Ion flux deviation from baseline (i.e., with no magnetic field) decreases in the presence of bias.

In principle, as described above, with a magnetic field at the wafer level, the plasma undergoes gyration motion. In an embodiment, plasma density is increased locally by using localized electromagnets included in an electrostatic chuck. The magnetic field introduced around the wafer can cause the local electron accelerated in cyclic motion, leading to locally enhanced molecular dissociation. A Hall effect is observed with the magnetic field. For example, with an inductively coupled plasma (ICP) source power only, the N pole results in higher etch rate (ER) at an upper left of the ER map. On the other hand, with ICP source power only, the S pole results in higher etch rate (ER) at a lower right of the ER map. Both scenarios are indicative of Hall effect from the magnetic field.

In an embodiment, addressing the above noted issues, electrostatic chuck (ESC) designs described herein include arrangements of electromagnets either embedded in or surrounding a periphery of a base of the ESC. The arrangements provide pixelated electromagnets with independent control of magnetic field strength and polarity. The controllability can be as small as the millimeter scale, as may be only limited by the electromagnet size. Electrostatic chucks described herein may be available to integrate with a local heating element which leads to dual process controls using thermal and magnetic means.

Figure 2:
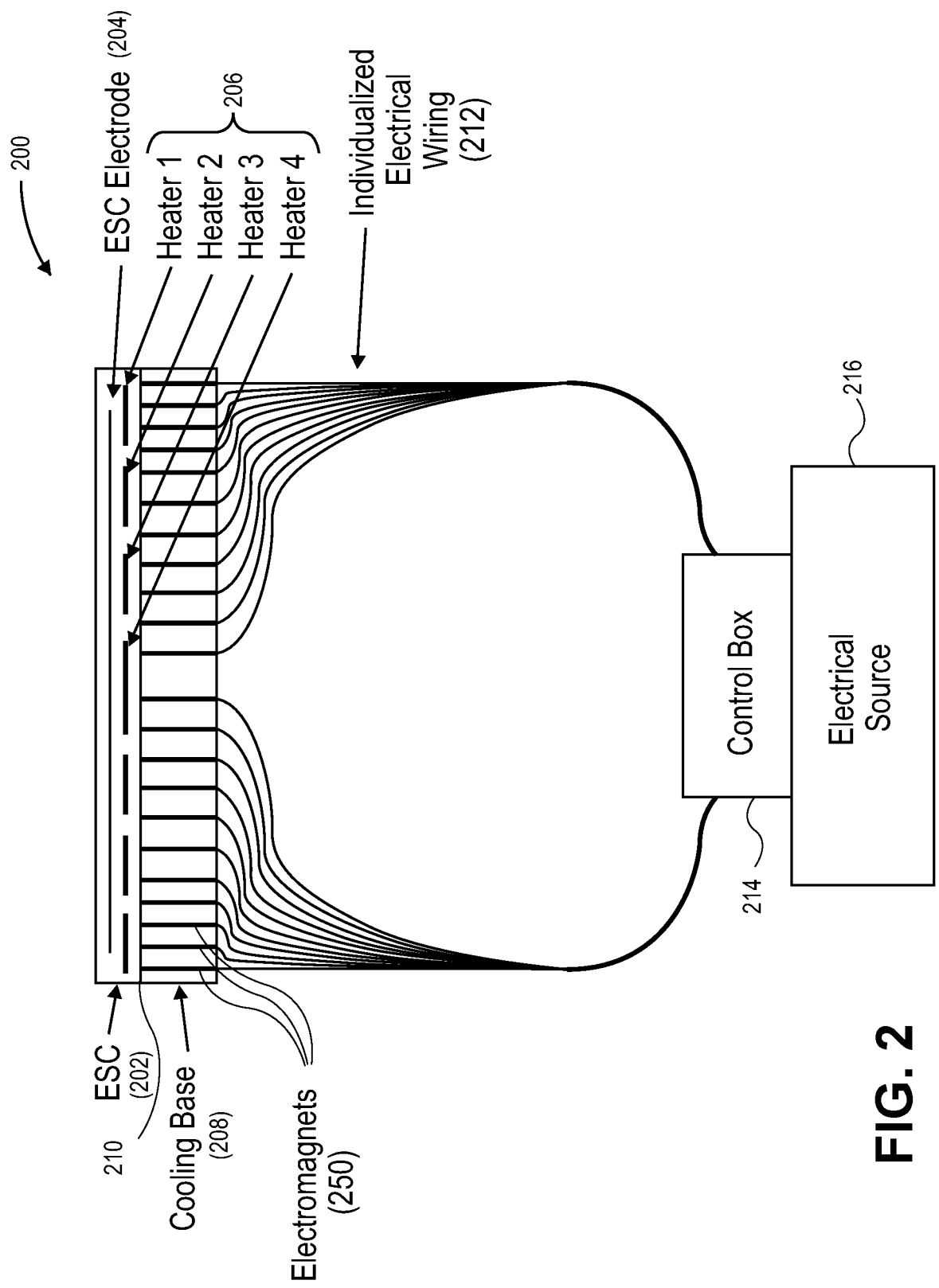
FIG. 2 illustrates a cross-sectional view of a portion of an electrostatic chuck (ESC) configured to support a wafer or substrate, in accordance with an embodiment of the present invention.

As a general example, FIG. 2 illustrates a cross-sectional view of a portion of an electrostatic chuck (ESC) configured to support a wafer or substrate, in accordance with an embodiment of the present invention.

Referring to FIG. 2, a pixelated electrostatic chuck 200 includes an electrostatic chuck top portion 202 (e.g., an $Al_2O_3$ or like solid ceramic plate). The electrostatic chuck portion includes an ESC electrode 204 (e.g., for RF applications) and a plurality of main heaters 206, such as heaters 1, 2, 3 and 4, etc. In the embodiment shown, a single or mono-polar ESC electrode configuration is used. The ESC portion 202 is bonded to a cooling base 208 through a bonding layer 210. A plurality of electromagnets 250 is disposed in the cooling based 208. Each of the plurality of electromagnets 250 is coupled to a control box 214 by an associated individualized electrical wiring 212. The control box 214 may be further coupled to an electrical source 216, and can independently control power to each of the electromagnets 250 via the associated individualized electrical wiring 212. As such, the configuration of pixelated electrostatic chuck 200 includes pixelated electromagnet routing on the back side of the electrostatic chuck.

In an embodiment, the plurality of electromagnets 250 is disposed in the cooling based 208 at a level approximately 1 centimeter or less below the electrostatic chuck top portion 202. In one such embodiment, the plurality of electromagnets 250 is disposed in the cooling based 208 at a level approximately in the range of 5-8 mm below the electrostatic chuck top portion 202. In an embodiment, the cooling base 208 includes a chiller plate with an aluminum (Al) body and capability for fluid flow there through. In an embodiment, in addition to the main heaters 206, although not depicted, a plurality of pixelated heaters (e.g., as a pixelated array of resistive heaters or a pixelated array of light pipes is also included in the cooling base 208. Thus, in one embodiment, in addition to an ESC that provides etch processing with improved plasma density uniformity by inclusion of a pixelated arrangement of electromagnets, fine tuning temperature control may also be incorporated into the ESC.

Figure 3:
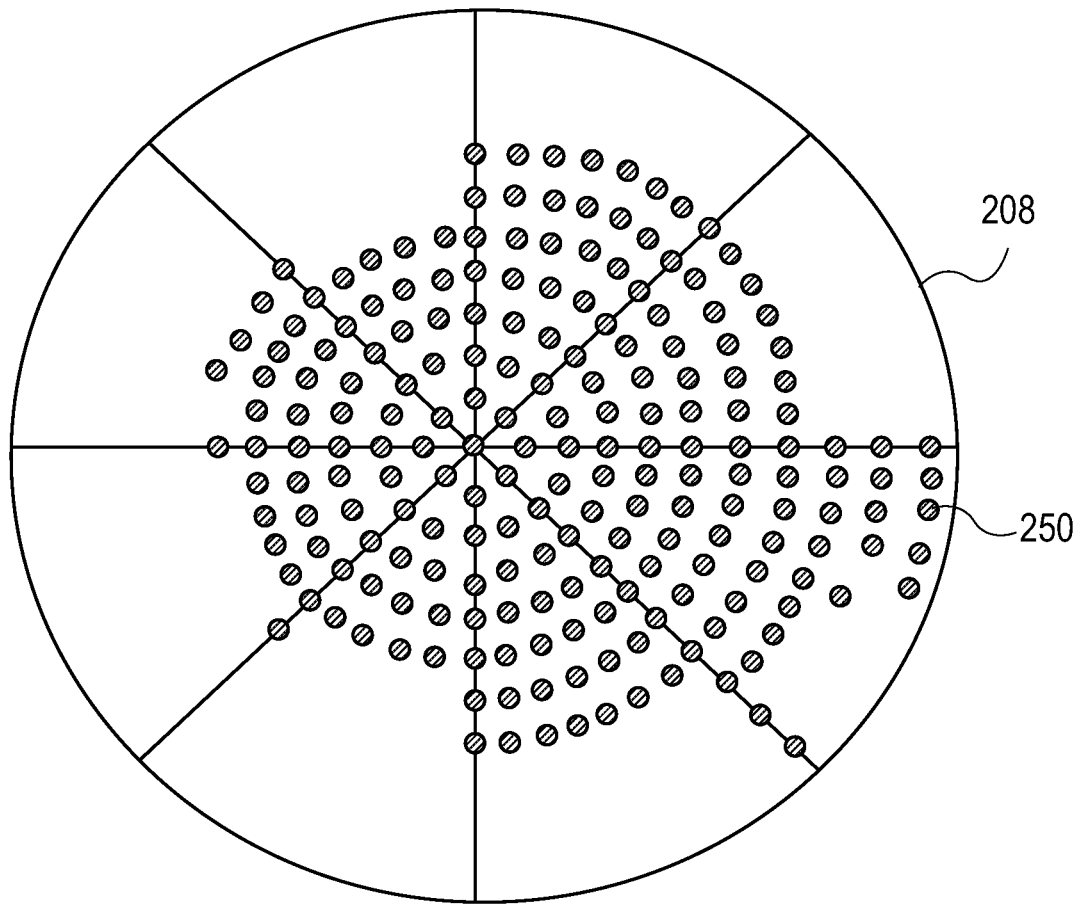
FIG. 3 is a plan view showing possible patterning of a plurality of electromagnets, in accordance with an embodiment of the present invention.

FIG. 3 is a plan view showing possible patterning of a plurality of electromagnets, in accordance with an embodiment of the present invention. Referring to FIG. 3, the cooling base 208 has the plurality of electromagnets 250 disposed therein. Any suitable arrangement may be made for inclusion of the plurality of electromagnets 250. In one such example, a layout of the plurality of electromagnets has a symmetrical or asymmetrical arrangement of between 25 to 500 independent electromagnets on the back of the ceramic plate 210 (i.e., as housed in the cooling base 308). Although a very specific asymmetrical pattern is depicted in FIG. 3 for illustrative purposes, other embodiments include an entirely symmetrical pattern. In the latter case, the pattern actually depicted in FIG. 3 can instead be used to depict only those electromagnets 250 that are active at a particular time in a processing operation. In a very particular exemplary embodiment of a symmetrical arrangement, 72 electromagnets are evenly distributed in the cooling base 208. Thus, it is to be understood that FIG. 3 illustrates only one of many possibilities of total included electromagnets 250, or a subset of activated electromagnets 250 having a specific application.

Figure 4:
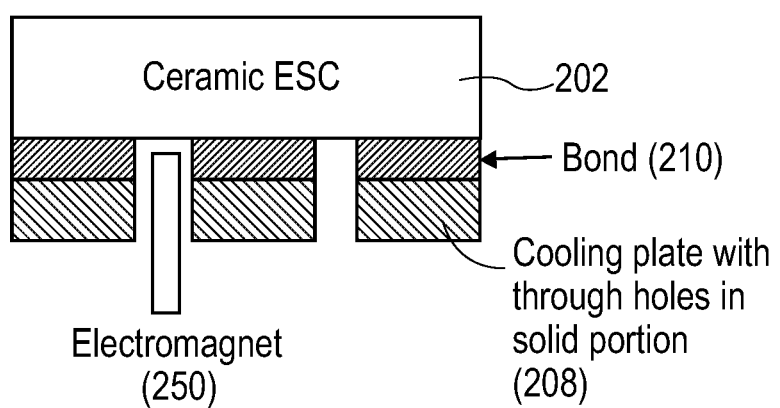
FIG. 4 illustrates a cross-sectional view of a portion of an electrostatic chuck (ESC) with pixelated magnetic field tuning capability, in accordance with an embodiment of the present invention.

FIG. 4 illustrates a cross-sectional view of a portion of an electrostatic chuck (ESC) with pixelated magnetic field tuning capability, in accordance with an embodiment of the present invention. Referring to FIG. 4, the ESC portion 202, the cooling base 208 and the bonding layer 210 are depicted. Additionally, an electromagnet 250 is depicted as accessing the ESC from the backside of the ESC portion 202. In an embodiment, as depicted, the bond layer is perforated to allow access of the electromagnet 250 to the backside of the ESC portion 202. Thus, a local magnetic field generated by the electromagnet 250 can be used to tune the magnetic field of a very localized portion of the ESC portion 202. In a particular embodiment, such localized tuning of a magnetic field is considered pixelated and is used to tune plasma density on a die by die basis, or other small region basis, of a wafer processed on the ESC. In a specific embodiment, then, bonding is used with perforations such that when the cooling plate 208 is bonded to the ceramic, the electromagnet 250 can access the through-hole in the bonding layer 210. In other embodiments, however, the bonding layer 210 is not perforated and separates the electromagnet 250 from the backside of the ESC portion 202.

In an alternative embodiment, the electromagnets are included to surround a base of an ESC, as opposed to being embedded in the base of the ESC. In an example, FIG. 5 illustrates a cross-sectional view of a portion of another electrostatic chuck (ESC) configured to support a wafer or substrate, in accordance with another embodiment of the present invention.

Figure 5:
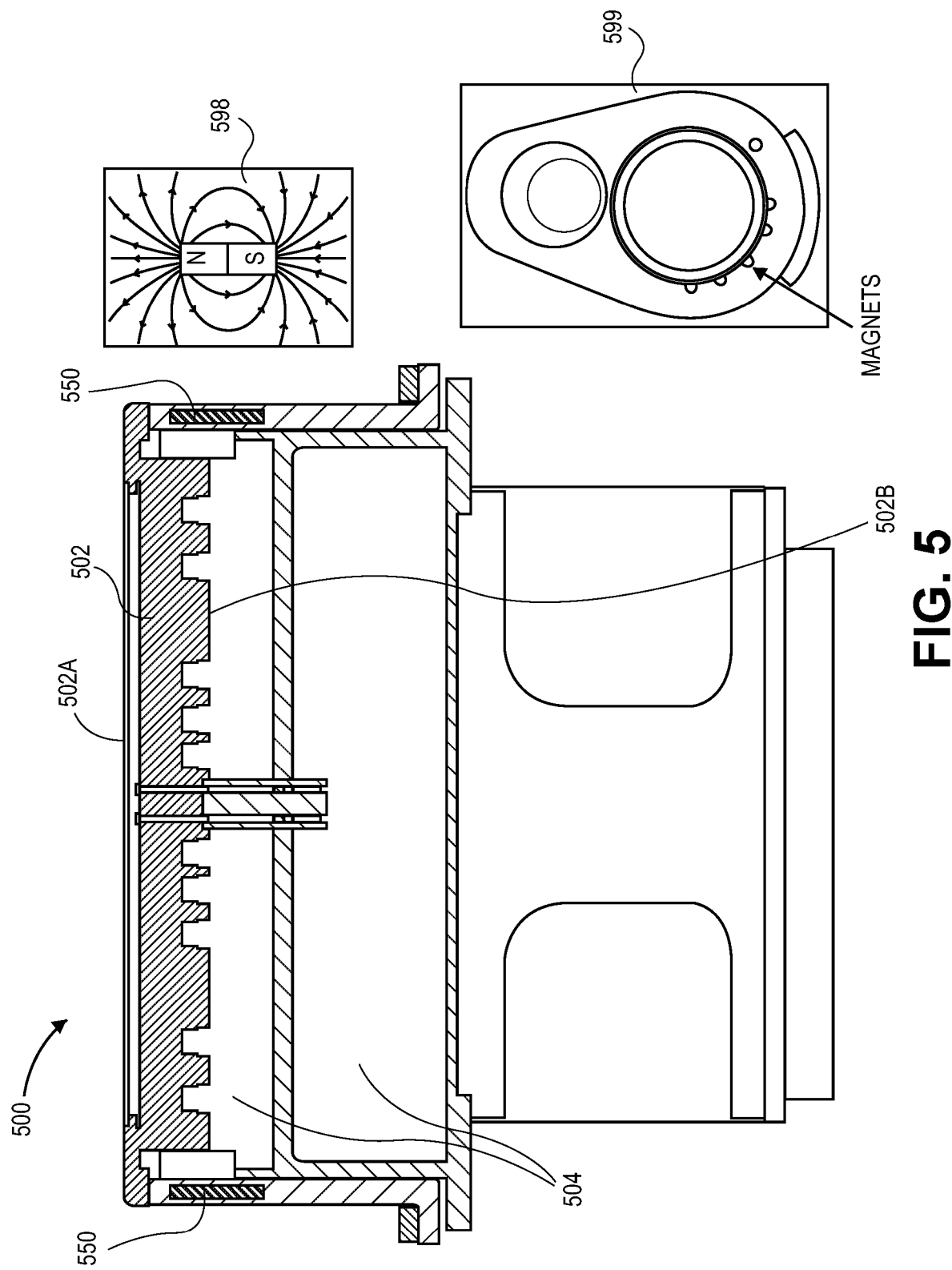
FIG. 5 illustrates a cross-sectional view of a portion of another electrostatic chuck (ESC) configured to support a wafer or substrate, in accordance with another embodiment of the present invention.

Referring to FIG. 5, an electrostatic chuck (ESC) 500 includes a ceramic plate 502 having a front surface 502A and a back surface 502B. The front surface 502A is for supporting a wafer or substrate. A base 504, such as a cooling base, is coupled to the back surface 502B of the ceramic plate 502. A plurality of electromagnets 550 is disposed to surround the perimeter of the base 504. As depicted in the inset 598, each of the plurality of electromagnets 550 is configured to provide pixelated magnetic field tuning capability for the ESC 500.

As depicted in the inset 599, the peripheral electromagnets are attached to a cathode liner. In the specific embodiment shown, the magnets were installed from the 6 o'CLK to 9 o'CLK positions. Neodymium disc permanent magnet were used, such as NdFe38 series magnets having approximately 0.394" Diameter, 0.394" Height. The magnetic field in the plasma region near the wafer edge is approximately 4-20 Gauss.

As described above, pixelated magnetic field functionality may be included in an electrostatic chuck. As an example, FIG. 6 illustrates a side schematic view of a substrate support suitable for accommodating pixelated magnetic field functionality, in accordance with some embodiments of the present invention.

Figure 6:
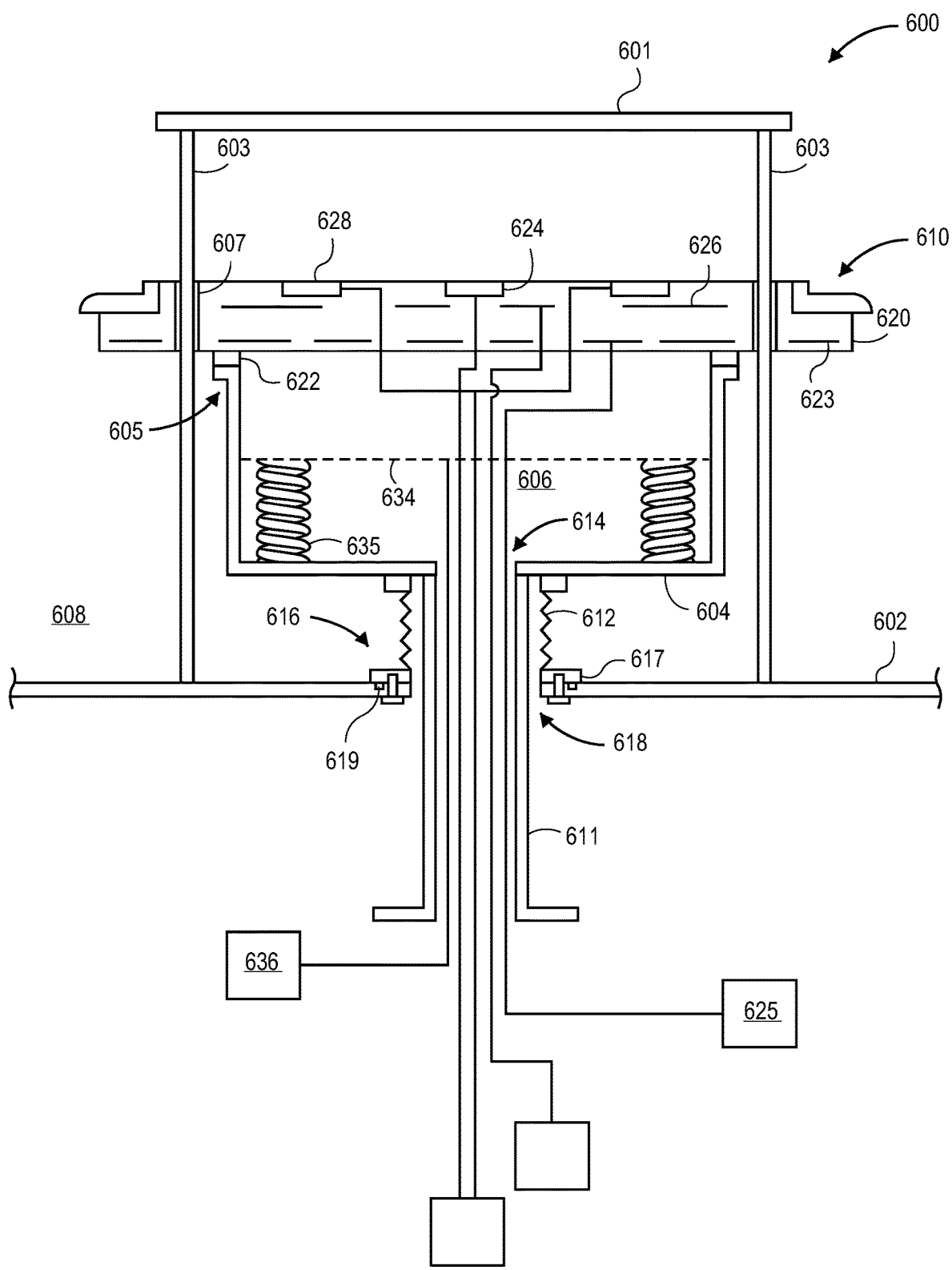
FIG. 6 illustrates a side schematic view of a substrate support, in accordance with some embodiments of the present invention.

FIG. 6 depicts a side schematic view of a substrate support 600 in accordance with some embodiments of the present invention. As illustrated in FIG. 6, the substrate support 600 is configured in a loading position to either receive or remove a substrate 601. For example, as illustrated in FIG. 6 and in the loading position, the substrate 601 may rest on a plurality of lift pins 603 above the substrate support 600. The lift pins 603 are movable with respect to a support surface of the substrate support 600, for example, via lift pin holes 607 that facilitate relative movement of the lift pins 603. The substrate support 600 may be disposed in a process chamber (a cut away view of a chamber wall 602 is illustrated in FIG. 6). The process chamber may be any suitable substrate processing chamber.

The substrate support 600 may include a body 604. The body 604 may have an interior volume 606 that is separated from a processing volume 608 of the process chamber. The interior volume 606 may be held at atmosphere, for example, about 14.7 pounds per square inch (psi), or be held under an inert atmosphere, such as nitrogen ($N_2$) or the like. The interior volume 606 is further isolated from, and protected from, any gases that may be present in the processing volume 608 of the process chamber. The process volume 608 may be held at atmospheric or sub-atmospheric pressures.

The interior volume 606 may be enclosed by an electrostatic chuck 610 at an upper end 605 of the body 604 and by a feed through structure 611, which may be welded or brazed to a lower opening 614 of the body 604. For example, as illustrated in FIG. 6, a bellows 612 may surround at least a portion of the feed through structure 611 and isolate the processing volume 608 from the exterior of the chamber and the interior volume 606. The bellows 612 may provide both a flexible section to facilitate motion of the substrate support 600 and a pathway for providing gases, electrical power, coolants at the like to the substrate support 600. The gases, electrical power, coolant and the like may be by provided via the feed through structure 611.

The bellows 612 may be coupled to the body 604 at the lower opening 614, for example, by welding or brazing. An opposing lower end 616 of the bellows 612 may be coupled to an opening 618 in the chamber wall 602. For example, as illustrated in FIG. 6, the lower end 616 of the bellows 612 may include a flange 617 which may be coupled via an o-ring 619, or copper gasket or the like to the chamber wall 602. The o-ring 619 may rest in a groove on the processing volume facing surface of the chamber wall 602. Other designs and coupling of the bellows 612 to the body 404 and the chamber wall 602 are possible.

The substrate support 600 may include a cooling plate 634 disposed in the interior volume 606 below the electrostatic chuck 610. For example, in some embodiments, the cooling plate 634 may be directly contacting an interior volume facing surface of the electrostatic chuck 610. However, this embodiment of the cooling plate 634 is merely exemplary and the cooling plate may not directly contact the electrostatic chuck 610. The cooling plate 634 may include a plurality of cooling channels (not shown) for circulating a coolant there through. The coolant may include any suitable liquid or gas coolant. In some embodiments, the coolant may be supplied to the cooling plate 634 via a coolant source 636 coupled to the cooling plate 634 via the feed through structure 611. For example, the cooling plate 634 may be engaged to the electrostatic chuck 610 by one or more springs 635 or any suitable engagement mechanism.

In some embodiments, the cooling plate 634 may include an inner and outer cooling plate. In some embodiments, the inner cooling plate may be disposed about a center gas line, and the outer cooling plate may be disposed about a plurality of outer gas lines. For example, the inner and outer cooling plates may be used to adjust cooling capacity depending on how the electrostatic chuck 610 is utilized, such as how electrical power is provided to the electrode(s) 626 and/or the one or more heaters 623 or the like. Further, the inner and outer cooling plates may be utilized to improve substrate temperature control or cool down the substrate support 600 from high temperatures. For example, the inner and outer cooling plates may be modulated to control heat transfer between the one or more heaters 623 and the substrate 601.

In some embodiments, the cooling plate 634 may include an upper and a lower cooling plate. The upper and lower cooling plates may be utilized to provide similar benefits as discussed above for the inner and outer cooling plates. The upper and lower cooling plates may be stacked such that upper cooling plate contacts the electrostatic chuck 610 via a foil while lower cooling plate contacts upper cooling plate. By independently controlling the flow of coolant to the upper and lower cooling plates, variable heat transfer is achieved between ceramic body 620 and cooling plate assembly 634. In some embodiments, each of the upper and lower cooling plates may provide uniform cooling over the entire diameter of cooling plate 634. In other embodiments, each of upper and lower cooling plates may provide different cooling to inner and outer regions of cooling plate 634. That is, in some embodiments, upper and lower cooling plates may be combined with inner and outer cooling plates.

The electrostatic chuck 610, thus, may include a ceramic plate 620. As illustrated in FIG. 6, the ceramic plate 620 may rest on a ring 622 disposed between the electrostatic chuck 610 and the upper end 605 of the body 604. For example, the ring 622 may comprise KOVAR™, or any suitable material. The ring 622 may secure the electrostatic chuck 610 to the upper end 605 of the body 604, for example, by welding or brazing the ring 622 to both the electrostatic chuck 610 and the upper end 605 of the body 604. The ceramic plate 620 may comprise any suitable ceramic material, such as aluminum nitride (AlN), aluminum oxide ($Al_2O_3$), or a doped ceramic, such as titania doped alumina or calcium doped aluminum nitride or the like. As illustrated in FIG. 6, the ceramic plate 620 may include a plurality of grooves 624 formed in a substrate supporting surface of the ceramic plate 620. The grooves may be used, for example, to provide a backside gas to a backside surface of the substrate 601. The ceramic plate 620 may further include an electrode or a plurality of electrodes 626, where the electrode(s) 626 may be used to secure the substrate 601 a processing surface 628 of the electrostatic chuck 610.

FIG. 6 illustrates the electrode(s) 626 in accordance with some embodiments of the invention. For example, as discussed above, the electrode(s) 626 may be utilized to secure the substrate 601 to the processing surface 628 of the electrostatic chuck 610. For example, in some embodiments, the electrode(s) 626 may utilized for controlled de-chucking from the electrostatic chuck 610, to chuck bowed substrates, or the like. For example, during de-chucking, gas may still be flowing through the grooves 624 and/or the pressure in the grooves may be higher than the pressure in the processing volume 608. Accordingly, for example, to prevent the substrate 601 from jumping off the electrostatic chuck 610, in the case of a plurality of electrodes, some of the electrodes 626 may be turned off prior to others to gradually de-chuck the substrate 601. For example, during chucking, larger substrates, such as 300 millimeter or greater, may be bowed. Accordingly, to flatten a bowed substrate against the electrostatic chuck 610, some of the electrodes 626 may be operated at a higher power and/or frequency that others of the electrodes 626 to flatten out the substrate.

As described above, the electrostatic chuck 610 may further include one or more heaters 623. The one or more heaters 623 may be coupled to one or more power supplies 625 and may be independently controllable. In some embodiments, the one or more heaters 623 may include a plurality of heaters 623, as illustrated in FIG. 6. For example, in some embodiments, the plurality of heaters 623 may include a central heater, a middle heater disposed about the central heater, and an outer heater disposed about the middle heater. Each of the central, middle and outer heaters may be coupled to the same or separate one or more power supplies 625 and independently controlled via a temperature feedback loop. For example, a first thermocouple may monitor a temperature of the ceramic plate 620 proximate the location of the central heater. Similarly, additional thermocouples may perform a similar function for the middle and outer heaters. In accordance with one or more embodiments of the present invention, a plurality of electromagnets is housed in the cooling plate assembly 634, underneath the ceramic body 620. In accordance with one or more embodiments of the present invention, a plurality of electromagnets is positioned around the perimeter of the cooling plate assembly 634, underneath the ceramic body 620. In either case, in one embodiment, each of the plurality of electromagnets is independently coupled to an electrical source by a corresponding electrical wiring.

An electrostatic chuck with variable pixelated magnetic field may be included in processing equipment suitable to provide an etch plasma in proximity to a sample for etching. For example, FIG. 7 illustrates a system in which an electrostatic chuck with variable pixelated magnetic field tuning capability can be housed, in accordance with an embodiment of the present invention.

Figure 7:
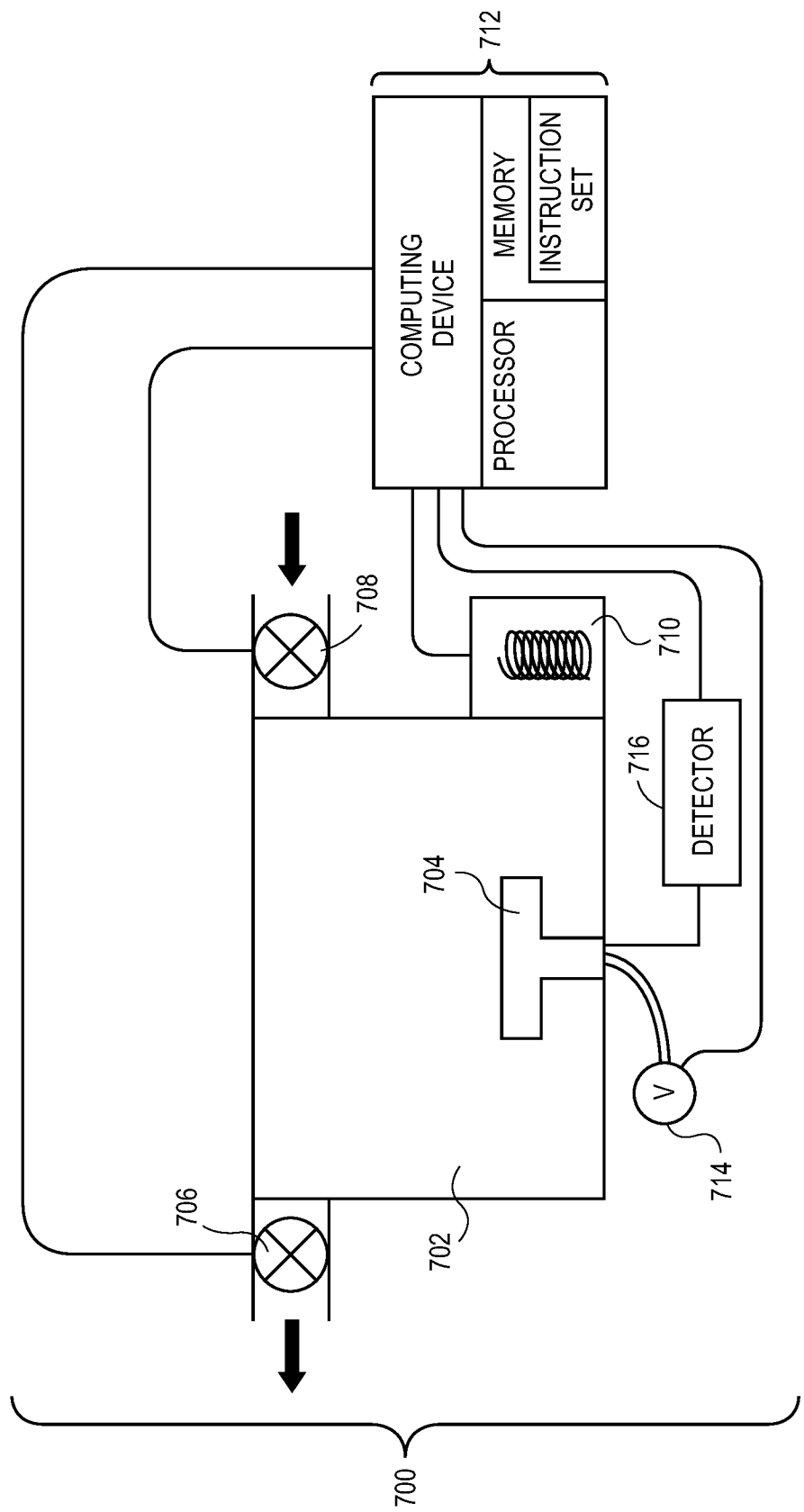
FIG. 7 illustrates a system in which an electrostatic chuck with variable pixelated magnetic field can be housed, in accordance with an embodiment of the present invention.

Referring to FIG. 7, a system 700 for conducting a plasma etch process includes a chamber 702 equipped with a sample holder 704 (e.g., an ESC having variable pixelated magnetic field tuning capability such as described above). An evacuation device 706, a gas inlet device 708 and a plasma ignition device 710 are coupled with chamber 702. A computing device 712 is coupled with plasma ignition device 710. System 700 may additionally include a voltage source 714 coupled with sample holder 704 and a detector 716 coupled with chamber 702. Computing device 712 may also be coupled with evacuation device 706, gas inlet device 708, voltage source 714 and detector 716, as depicted in FIG. 7.

Chamber 702 and sample holder 704 may include a reaction chamber and sample positioning device suitable to contain an ionized gas, i.e. a plasma, and bring a sample in proximity to the ionized gas or charged species ejected therefrom. Evacuation device 706 may be a device suitable to evacuate and de-pressurize chamber 702. Gas inlet device 708 may be a device suitable to inject a reaction gas into chamber 702. Plasma ignition device 710 may be a device suitable for igniting a plasma derived from the reaction gas injected into chamber 702 by gas inlet device 708. Detection device 716 may be a device suitable to detect an end-point of a processing operation. In one embodiment, system 700 includes a chamber 702, a sample holder 704, an evacuation device 706, a gas inlet device 708, a plasma ignition device 710 and a detector 716 similar to, or the same as, a Conductor etch chamber or related chambers used on an Applied Materials® AdvantEdge system.

It is to be understood that although an etch chamber is described above, electrostatic chucks such as those described herein may instead be included in other semiconductor processing chambers. Examples of other suitable semiconductor processing chambers include, but are not limited to, chemical vapor deposition (CVD) or physical vapor deposition (PVD) process chambers.

Embodiments of the present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 8:
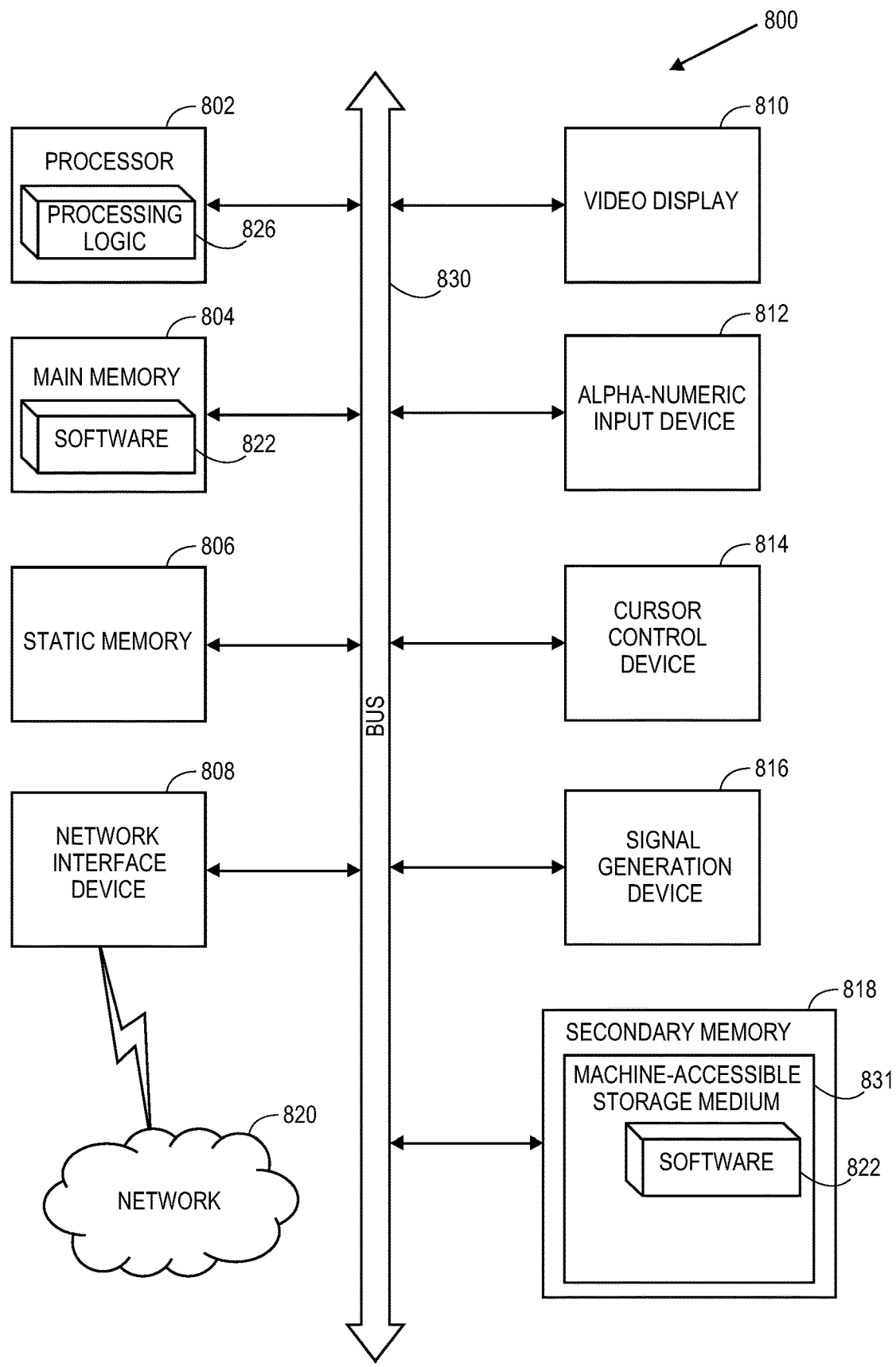
FIG. 8 illustrates a block diagram of an exemplary computer system, in accordance with an embodiment of the present invention.

FIG. 8 illustrates a diagrammatic representation of a machine in the exemplary form of a computer system 800 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In one embodiment, computer system 800 is suitable for use as computing device 712 described in association with FIG. 7 and/or control box 214 described in association with FIG. 2.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations discussed herein.

The computer system 800 may further include a network interface device 808. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 831 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 831 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Thus, electrostatic chucks with variable pixelated magnetic field have been disclosed. In an embodiment, an electrostatic chuck (ESC) includes a ceramic plate having a front surface and a back surface, the front surface for supporting a wafer or substrate. A base is coupled to the back surface of the ceramic plate. A plurality of electromagnets is disposed in the base, the plurality of electromagnets configured to provide pixelated magnetic field tuning capability for the ESC.

What is claimed is:

1. A semiconductor processing system, comprising:
   a chamber coupled to an evacuation device, a gas inlet device, a plasma ignition device, and a detector;
   a computing device coupled with the plasma ignition device;
   a voltage source coupled with a sample holder comprising an electrostatic chuck (ESC), the ESC disposed in the chamber and comprising:
   a ceramic plate having a front surface and a back surface, the front surface for supporting a wafer or substrate;
   a base coupled to the back surface of the ceramic plate; and
   a plurality of electromagnets disposed in the base, the plurality of electromagnets configured to provide pixelated magnetic field tuning capability for the ESC; and
   an electrical source, wherein each of the plurality of electromagnets is independently coupled to the electrical source by a corresponding electrical wiring.

2. The semiconductor processing system of claim 1, wherein the base of the ESC is coupled to the back surface of the ceramic plate of the ESC by a perforated bonding layer, the perforated bonding layer having openings to accommodate the plurality of electromagnets of the ESC.

3. The semiconductor processing system of claim 1, wherein the ceramic plate of the ESC comprises one or more electrical heaters housed therein.

4. The semiconductor processing system of claim 1, wherein the ceramic plate of the ESC comprises an RF electrode housed therein.

5. The semiconductor processing system of claim 1, wherein the base of the ESC is a cooling base.

6. The semiconductor processing system of claim 1, wherein each of the plurality of electromagnets of the ESC is independently controllable.

7. The semiconductor processing system of claim 1, wherein the plurality of electromagnets is a plurality of discrete electromagnets.

8. The semiconductor processing system of claim 7, wherein the plurality of discrete electromagnets comprises discrete electromagnets arranged in a plurality of concentric circles.

9. The semiconductor processing system of claim 8, wherein each of the plurality of concentric circles comprises a plurality of the plurality of discrete electromagnets.

* * * * *